United States Patent
Miller et al.

(10) Patent No.: US 11,930,603 B2
(45) Date of Patent: Mar. 12, 2024

(54) BANNER DISPLAY

(71) Applicant: Daktronics, Inc., Brookings, SD (US)

(72) Inventors: Kent Shane Miller, Brookings, SD (US); Ashton Flowers, Brookings, SD (US); Jon Settingsgard, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 17/387,365

(22) Filed: Jul. 28, 2021

(65) Prior Publication Data

US 2021/0360802 A1   Nov. 18, 2021

Related U.S. Application Data

(63) Continuation of application No. 16/477,498, filed as application No. PCT/US2018/013594 on Jan. 12, 2018, now Pat. No. 11,109,495.
(Continued)

(51) Int. Cl.
*H05K 5/00* (2006.01)
*G09F 9/302* (2006.01)
*H05K 5/02* (2006.01)

(52) U.S. Cl.
CPC ......... *H05K 5/0017* (2013.01); *G09F 9/3026* (2013.01); *H05K 5/0021* (2013.01); *H05K 5/0204* (2013.01); *H05K 5/0217* (2013.01)

(58) Field of Classification Search
CPC .. H05K 5/0017; H05K 5/0021; H05K 5/0204; H05K 5/0217; G09F 9/3026
See application file for complete search history.

(56) References Cited

U.S. PATENT DOCUMENTS

| | | | | |
|---|---|---|---|---|
| 5,427,344 | A | * | 6/1995 | Beauchemin ........ A44B 11/125 182/187 |
| 6,065,854 | A | * | 5/2000 | West ..................... G09F 9/3026 362/249.14 |

(Continued)

FOREIGN PATENT DOCUMENTS

| CN | 201281210 Y | 7/2009 |
|---|---|---|
| CN | 202454188 U | 9/2012 |

(Continued)

OTHER PUBLICATIONS

"U.S. Appl. No. 16/477,498, Corrected Notice of Allowability dated Jul. 30, 2021", 3 pgs.

(Continued)

*Primary Examiner* — Joseph Suh
(74) *Attorney, Agent, or Firm* — Schwegman Lundberg & Woessner, P.A.

(57) ABSTRACT

A display system comprises a display of one or more display surfaces, each formed from a plurality of display modules arranged in proximity. Each display module comprising light-emitting elements configured to collectively display information. The display system also comprises one or more tension members and one or more base supporting members connected to the one or more tension members and positioned proximate to one or more of the display modules located at a vertical base of the display. The one or more base supporting members are coupled to the display modules located at the vertical base such that the one or more base supporting members provide underlying support to the plurality of display modules. The one or more tension members and the one or more base supporting members support the weight of the display when the one or more tension members are connected to a support structure.

20 Claims, 11 Drawing Sheets

Related U.S. Application Data

(60) Provisional application No. 62/446,144, filed on Jan. 13, 2017.

(56) References Cited

U.S. PATENT DOCUMENTS

| | | | |
|---|---|---|---|
| 6,314,669 B1* | 11/2001 | Tucker | G09F 9/3026 345/82 |
| 7,437,843 B2 | 10/2008 | Lefebvre | |
| 7,516,843 B2* | 4/2009 | Konop | B65D 73/0035 206/349 |
| 8,104,204 B1* | 1/2012 | Syrstad | G09F 9/3026 40/544 |
| 9,812,044 B1* | 11/2017 | Yousef | G09F 9/3026 |
| 10,301,060 B2* | 5/2019 | Strekowski | B65D 77/0433 |
| 11,109,495 B2 | 8/2021 | Miller et al. | |
| 2003/0058191 A1* | 3/2003 | Yuhara | G09F 9/33 345/44 |
| 2003/0182834 A1 | 10/2003 | Cozzilino | |
| 2005/0160648 A1* | 7/2005 | Voluckas | G09F 17/00 40/617 |
| 2007/0159413 A1* | 7/2007 | Thorjussen | G09G 3/001 345/1.3 |
| 2008/0110067 A1* | 5/2008 | Smith | G09F 13/00 40/541 |
| 2008/0200247 A1* | 8/2008 | Yoshizawa | G07F 17/3211 463/31 |
| 2009/0188819 A1* | 7/2009 | Carney, Jr. | A63B 71/0045 206/459.5 |
| 2009/0290076 A1* | 11/2009 | Tait | G09F 19/226 348/836 |
| 2011/0116000 A1* | 5/2011 | Dunn | F28F 3/00 361/679.01 |
| 2012/0268867 A1* | 10/2012 | Lin | H05K 5/02 361/679.01 |
| 2013/0188327 A1* | 7/2013 | Lee | G09F 9/3026 361/807 |
| 2013/0220957 A1* | 8/2013 | Malik | A47B 96/16 211/119.004 |
| 2014/0053436 A1 | 2/2014 | English | |
| 2014/0078685 A1* | 3/2014 | Lee | G09F 9/3026 361/730 |
| 2014/0268786 A1* | 9/2014 | Quaal | G09F 13/04 362/249.08 |
| 2015/0036319 A1* | 2/2015 | Ning | G02F 1/133608 362/97.1 |
| 2015/0187241 A1* | 7/2015 | Hall | G09F 9/33 29/428 |
| 2015/0225156 A1* | 8/2015 | Bruns | A47F 7/0042 206/487 |
| 2016/0224306 A1* | 8/2016 | Rycyna, III | G09G 3/32 |
| 2016/0356041 A1* | 12/2016 | Oleske | E04B 9/225 |
| 2017/0258249 A1* | 9/2017 | Kim | A47F 5/08 |
| 2017/0310090 A1* | 10/2017 | Woodley | H02B 1/04 |
| 2018/0096642 A1* | 4/2018 | Vishakantaiah | G06F 1/1654 |
| 2019/0373745 A1 | 12/2019 | Miller et al. | |

FOREIGN PATENT DOCUMENTS

| | | |
|---|---|---|
| CN | 202512834 U | 10/2012 |
| CN | 103399429 A | 11/2013 |
| CN | 203759997 U | 8/2014 |
| CN | 110494910 A | 11/2019 |
| EP | 2685444 B1 | 3/2017 |

OTHER PUBLICATIONS

"European Application Serial No. 18709155.8, Response filed Jun. 22, 2021 to Communication Pursuant to Article 94(3) EPC dated Mar. 26, 2021", 15 pgs.

"European Application Serial No. 18709155.8, Communication Pursuant to Article 94(3) EPC dated May 20, 2022", 4 pgs.

"European Application Serial No. 18709155.8, Response filed Sep. 9, 2022 to Communication Pursuant to Article 94(3) EPC dated May 20, 2022", 6 pgs.

"U.S. Appl. No. 16/477,498, Advisory Action dated Mar. 22, 2021", 3 pgs.

"U.S. Appl. No. 16/477,498, Examiner Interview Summary dated Mar. 1, 2021", 2 pgs.

"U.S. Appl. No. 16/477,498, Examiner Interview Summary dated Apr. 5, 2021", 2 pgs.

"U.S. Appl. No. 16/477,498, Final Office Action dated Jan. 28, 2021", 22 pgs.

"U.S. Appl. No. 16/477,498, Non Final Office Action dated Oct. 19, 2020", 23 pgs.

"U.S. Appl. No. 16/477,498, Notice of Allowance dated Apr. 30, 2021", 6 pgs.

"U.S. Appl. No. 16/477,498, Preliminary Amendment filed Jul. 11, 2019", 8 pgs.

"U.S. Appl. No. 16/477,498, Response filed Jan. 5, 2021 to Non Final Office Action dated Oct. 19, 2020", 13 pgs.

"U.S. Appl. No. 16/477,498, Response filed Mar. 15, 2021 to Final Office Action dated Jan. 28, 2021", 23 pgs.

"U.S. Appl. No. 16/477,498, Supplementary Amendment filed Mar. 31, 2021", 16 pgs.

"Australian Application Serial No. 2018207625, First Examination Report dated Apr. 23, 2020", 3 pgs.

"Australian Application Serial No. 2018207625, Response filed Mar. 3, 2021 to Subsequent Examiners Report dated Feb. 2, 2021", 11 pgs.

"Australian Application Serial No. 2018207625, Response filed Sep. 17, 2020 to First Examination Report dated Apr. 23, 2020", 14 pgs.

"Australian Application Serial No. 2018207625, Response filed Dec. 21, 2020 to Subsequent Examiners Report dated Oct. 9, 2020", 3 pgs.

"Australian Application Serial No. 2018207625, Subsequent Examiners Report dated Feb. 2, 2021", 5 pgs.

"Australian Application Serial No. 2018207625, Subsequent Examiners Report dated Oct. 9, 2020", 5 pgs.

"Chinese Application Serial No. 201880011751.X, Office Action dated Dec. 30, 2020", w/ English translation, 16 pgs.

"Chinese Application Serial No. 201880011751.X, Response filed Apr. 2, 2021 to Office Action dated Dec. 30, 2020", w/English Claims, 14 pgs.

"European Application Serial No. 18709155.8, Communication Pursuant to Article 94(3) EPC dated Mar. 26, 2021", 9 pgs.

"European Application Serial No. 18709155.8, Response filed Feb. 28, 2020 to Communication pursuant to Rules 161(2) and 162 EPC dated Aug. 23, 2019", 27 pgs.

"International Application Serial No. PCT/US2018/013594, International Preliminary Report on Patentability dated Jul. 25, 2019", 9 pgs.

"International Application Serial No. PCT/US2018/013594, International Search Report mailed May 30, 2018", 4 pgs.

"International Application Serial No. PCT/US2018/013594, Written Opinion dated May 30, 2018", 7 pgs.

* cited by examiner

BANNER DISPLAY

CROSS-REFERENCE TO RELATED APPLICATIONS

This application is a continuation of U.S. patent application Ser. No. 16/477,498, filed Jul. 11, 2019, which application is a U.S. National Stage Filing under 35 U.S.C. 371 from International Application No. PCT/US2018/013594, filed on Jan. 12, 2018, and published as WO 2018/132722 on Jul. 19, 2018, which application claims priority to U.S. Provisional Application Ser. No. 62/446,144, filed on Jan. 13, 2017, entitled "BANNER DISPLAY," the disclosures of which are incorporated herein by reference in their entireties.

BACKGROUND

Displays comprising a plurality of light-emitting elements, or display modules, are used for the display of information. In some applications, such as digital billboards or scoreboards, individual display modules can be connected together and operated collectively to form a larger display. The larger display can be hung from a support structure, such as the ceiling of a building or a support beam, to provide a display with the appearance of an overhanging banner, often referred to as a banner display.

SUMMARY

A banner display system can in include a plurality of display modules that are hung from a support structure with one or more supporting tension members, such as one or more cables or chains. In some examples, the plurality of display modules are supported by a support cabinet. The one or more supporting tension members can be connected to a base supporting member that is located proximate to one or more of the display modules at a base of the display, e.g., proximate to a vertical bottom of the display. The plurality of display modules are supported by the base supporting member, either directly or indirectly through a connection to one or more intermediate supporting structures. The base supporting member, in turn, is supported by the one or more supporting tension members. In some examples, the one or more supporting tension members pass through the support cabinet so that they are not visible.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
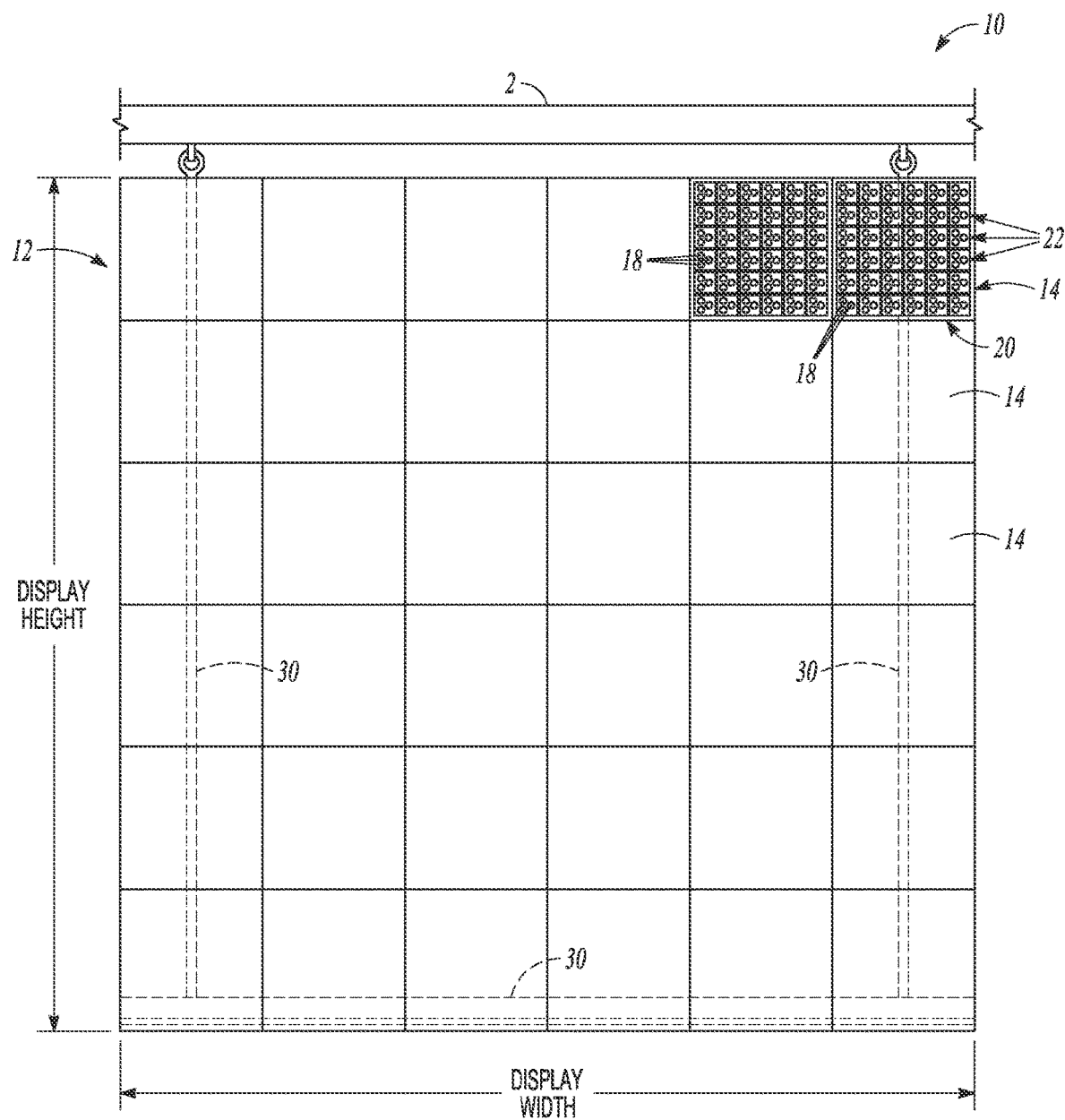
FIG. 1 is a front plan view of an example banner display system for the display of visual information.

In the following Detailed Description, reference is made to the accompanying drawing which form a part hereof. The drawings show, by way of illustration, examples of banner displays and examples of systems for hanging a banner display to a support structure, such as the ceiling of a building or a support beam. The examples are described in sufficient detail to enable those skilled in the art to practice, and it is to be understood that other embodiments can be utilized and that changes can be made without departing from the scope of the present disclosure. Therefore, the following Detailed Description is not to be taken in a limiting sense, and the scope of the present disclosure is defined by the appended claims and their equivalents.

FIGS. 1-7 shows several views of an example banner display system 10. The banner display system 10 includes a banner display 12 that is supported in a hanging manner from a support structure 2. The support structure 2 can be, for example, a portion of a ceiling or a support beam in or on a building. The banner display 12 includes a plurality of display modules 14. The plurality of display modules 14 are mounted to and supported by a support chassis 16, also referred to herein as a support cabinet 16.

The display modules 14 are configured to display one or more of video, graphical, or textual information. For this reason, the display modules 14 may also be referred to herein as "video display modules" or "graphical display modules" and the banner display 12 may be referred to as a "video display" or a "graphical display." In an example, each display module 14 includes a plurality of light-emitting elements 18 coupled to a front face 20 of the display module 14 (FIG. 1). The light-emitting elements 18 are positioned on the front faces 20 of the display modules 14 and the light-emitting elements 18 are operated in such a way so that the display modules 14 display the video, graphical, or textual information to someone who is viewing the banner display 12.

The light-emitting elements 18 can be any type of light-emitting technology known or yet to be discovered for the display of visual information, such as video, graphical, or textual information. At the time of filing of the present application, light-emitting diodes (LEDs) are one of the most common light-emitting technologies in use for video or graphical displays of the type described herein. As such, for the sake of brevity, the light-emitting elements 18 will be referred to as LEDs 18 throughout the present disclosure. However, it will be understood that any time the following description uses the term "light-emitting diode" or "LED," that light-emitting devices other than LEDs can be used, however, including, but not limited to, liquid crystal display devices (LCDs), organic light-emitting diodes (OLEDs), organic light-emitting transistors (OLETs), surface-conduction electron-emitter display devices (SEDs), field-emission display devices (FEDs), laser TV quantum dot liquid crystal display devices (QD-LCDs), quantum dot light-emitting diode display devices (QD-LEDs), ferro-liquid display devices (FLDs), and thick-film dielectric electroluminescent devices (TDELs).

In an example, the LEDs 18 are arranged into an array of pixels 22, e.g., with each pixel including one or more LEDs 18 grouped together in close proximity. The LEDs 18 and the pixels 22 are only shown on two display modules 14 in FIG. 1 and are omitted from the banner display shown in the other figures so that other features of the banner displays are easier to discern. Also, the sizes of the pixels 22 and the LEDs 18 relative to the overall size of the banner display 12 are not necessarily shown on the scale However, a person of ordinary skill in the art will understand that all of the display modules 14 that make up the banner display 12 can include pixels 22 of LEDs 18 or that each LED 18 and/or pixel 22 can have a different size relative to the banner display 12.

In an example, multiple LEDs 18 are positioned together at each pixel 22. In some examples, the plurality of LEDs 18 include a plurality of different-colored LEDs 18 such that different-colored LEDs 18 of each pixel 22 can be cooperate to display what appears to be a spectrum of different colors for the viewer of the banner display 12. In an example, each pixel 22 includes a red LED 18, a green LED 18, and a blue LED 18, wherein the red, green, and blue LEDs of each pixel 22 cooperate to provide essentially the entire color spectrum that is visible to humans based on whether one, two, or all three of the LEDs 18 in a pixel 22 are lit and at what intensities. The front face 20 can also provide a black or empty looking surface over a portion of the display, when desired, by deactivating or turning off the LEDs in a particular pixel 22.

In an example, the plurality of display modules 14 are mounted to the support cabinet 16 such that adjacent display modules 14 are in close proximity to one other and the plurality of display modules 14 are operated together in such a way as to display the video, graphical, or textual information in a cohesive manner so that the entire banner display 12 appears to a viewer as a single display that is larger than the individual display modules 14.

In an example, the pixels 22 are arranged in a grid-like array, such as a grid comprising a specified number of rows and a specified number of columns of the pixels 22. The banner display 12 can be controlled, for example with control software and/or one or more hardware controllers, so that visual information, e.g., video, graphical, or textual information, is broken down into coordinates. Each coordinate can correspond to a specific pixel location within the overall banner display 12, and the control software and/or the one or more hardware controllers can operate each pixel according to a program that specifies a condition for each coordinate within the image and controls each of the pixels 22 so that it will appear to emit light that meets condition specified. For example, if the banner display 12 is displaying a video or animation, the control software and/or the one or more hardware controllers can be fed the data corresponding to the video or animation, and the control software and/or the one or more hardware controllers can break the video or animation data down into conditions for each pixel 22, such as the time within the video or animation, the color that a pixel 22 is to display at that time and the intensity of the pixel 22 at that time. The control software and/or the one or more hardware controllers can also convert the information regarding color and intensity into specific operating parameters for each LED 18 in a particular pixel 22, such as the power that will be supplied to the red LED 18, the blue LED 18, and the green LED 18 in that pixel 22 and for how long in order to achieve the specified color and intensity at the specified time. The control software and/or the one or more hardware controllers can then send control signals to the pixels 22 or to individual LEDs 18 that can operate the pixels 22 according to the video or animation. Although a grid or grid-like array of LED pixels, as summarized above, is common for video banner displays, the banner display 12 described herein can use other arrangements of the LEDs 18 or other systems for addressing the LEDs 18 can be used without varying from the scope of the present invention.

In an example, the banner display 12 can be configured so that visual information can be displayed from more than one side of the banner display 12. For example, the example banner display 12 shown in FIGS. 1-7 includes a front display surface 24 on a first, or front, side of the banner display 12 and a rear display surface 26 on a second, or rear, side of the banner display 12 (best seen, for example, in FIGS. 3, 6, & 7. In the example shown in FIGS. 1-7, the front display surface 24 and the rear display surface 26 are substantially identical, with the only difference being that the front display surface 24 and the rear display surface 26 are facing on opposite directions. For example, both display surfaces 24, 26 include a plurality of display modules 14 arranged in a close arrangement, as described above, so that LEDs the front display surface 24 and the rear display surface 26 (such as the LEDs 18 shown in FIG. 1) can be operated together to display visual information on the display surfaces 24, 26. The display modules 14 of the front display surface 24 and the rear display surface 26 can be mounted onto the support cabinet 16. For example, the display modules 14 of the front display surface 24 can be mounted onto a first side of the support cabinet 16 and the display modules 14 of the rear display surface 26 can be mounted onto a second side of the support cabinet 16. In this way, the support cabinet 16, the front display surface 24, and the rear display surface 26 can at least partially enclose an interior space 28 of the banner display 12 (best seen in FIGS. 3, 6, and 7).

A banner display need not have the back-to-back arrangement of the front display surface 24 and the rear display surface 26 as in the banner display 12 shown in FIGS. 1-7 in order to use the mounting and support structures of the banner display system 10 described herein. Rather, a banner display that only included a single display (that is, a display made up of only a single set of one or more display modules oriented in the same direction) could also be hung from a support structure using the same hanging structures described below. Similarly, as described in more detail with respect to FIGS. 11A-11C, a banner display with more than two different displays can be hung and supported by the hanging structures described below without varying from the scope of the present invention.

As mentioned above, the banner display 12 is hung from the support structure 2. In an example, the banner display system 10 includes one or more supporting tension members 30 that are coupled to the support structure 2 and to the banner display 12 in order to support the banner display 12 from the support structure 2. In an example, each tension member 30 is a mechanical structure with a length in a vertical direction (e.g., up and down in FIG. 1) that is substantially longer than its width in a horizontal direction (e.g., left to right or in and out of FIG. 1), and that is capable of withstanding a substantial tensile force exerted between the banner display 12 and the support structure 2. Examples of tension members 30 that might be commonly used to support the banner display 12 to the support structure 2 include, but are not limited to, cables (such as steel cables), rods (such as metal rebar rods), or thin metal bars. In some examples, the material that the tension members 30 are made from and the physical shape that the tension members 30 take is not important so long as the tension members 30 can collectively support the banner display 12 and so long as each tension member 40 fits within the space allotted for it within the banner display 12 (as described in more detail below). In an example, the tension members 30 comprise cables, such as metal cables, for example steel cables. For this reason, the tension members 30 will be referred to as cables 30 for the remainder of this description. However, a person of ordinary skill in the art will understand that other forms of tension members 30 can be used without varying from the scope of the present invention.

In previous banner displays that hung from a support structure, the cables or other tension members would be connected to a primary support member, such as a support beam, at the top of the support cabinet for the banner display. The display modules that made up the banner display would then be hung from the top support member, either by being connected to the top support member or by being connected to an intermediate member connected to the top support member, such as a portion of the support cabinet. For example, a first set of display modules might be coupled to the top support member or to a portion of the support cabinet that is coupled to the top support member. The first set of display modules would then hang off of the top support member or the intermediate support member. A second set of display modules would be mounted below the first set of display modules, a third set of display modules would be below the second set of display modules, and so on. Over time, banner displays with this configuration have been known to form visual seams at the junction between display modules because gravity tends to pull the display modules apart to form the visual seams. The ability of a particular banner display to resist visual seams was typically limited by the strength of the materials and structures that form the support cabinet. For this reason, the problem of visual-seam formation has become particularly pronounced as the display market moves toward more and more lightweight displays, which has tended to require support cabinets with less and less structure. The reduced structure of these more lightweight displays can tend to be more easily pulled apart over time by gravity.

The banner display system 10 of the present invention provides a solution to the problem of visual-seem formation. In particular, the cables 30 in the banner display system 10 of the present invention are not coupled to a top support member, as in previous banner displays. Rather, the cables 30 in the banner display system 10 extend down to a bottom portion of the banner display 12 and are coupled to a primary support member 32 located at or proximate to the base of the banner display 12. As used herein, the term "base" can refer to one or more structures located at or proximate to a vertical bottom of the banner display 12. In particular, the term "base" may be used herein to refer to a position that is proximate to the bottom-most display modules 14 that make up one or more of the display surfaces of the banner display 12 (e.g., the front display surface 24 and the rear display surface 26). For this reason, these bottom-most display modules 14 may be referred to herein as "base display modules 14" for brevity. Similarly, the primary support member 32 will also be referred to herein as a "base support member" or a "base member."

The base member 32 provides underlying or substantially underlying support the display modules 14. As used herein, the term "underlying support" can refer to the base member 32 providing direct or indirect support to one or more of the base display modules 14 so that when gravity acts to pull the display modules 14 downward, the force exerted to counteract gravity is generally acting upward at or proximate to a vertical bottom of the base display modules 14, or in some examples from a lateral side of the base display modules 14, and the force is being exerted from the base member 32 (which may or may not be through one or more intermediate connecting structures, as described below) rather than the gravity-counteracting force acting on the top portion of the base display modules and being exerted from another display module in the display, as with the top-supported displays described above. In some examples, the base member 32 is arranged and connected to the base display modules 14 so that as gravity acts on the banner display 12, it pulls the display modules 14 into the structure providing the primary support to the base display modules 14, that is into the base member 32. This is in contrast to the banner display designs described above where the display modules are supported from a top support member, and where gravity tends to pull each display modules away from their primary support structures, i.e., the display modules immediately above the base display modules or the support cabinet to which they are mounted. As noted above, in these top-supported banner displays, the limiting factor in the prevention of visual seam formation is the mechanical strength of the material and structure of the support cabinet.

Figure 6:
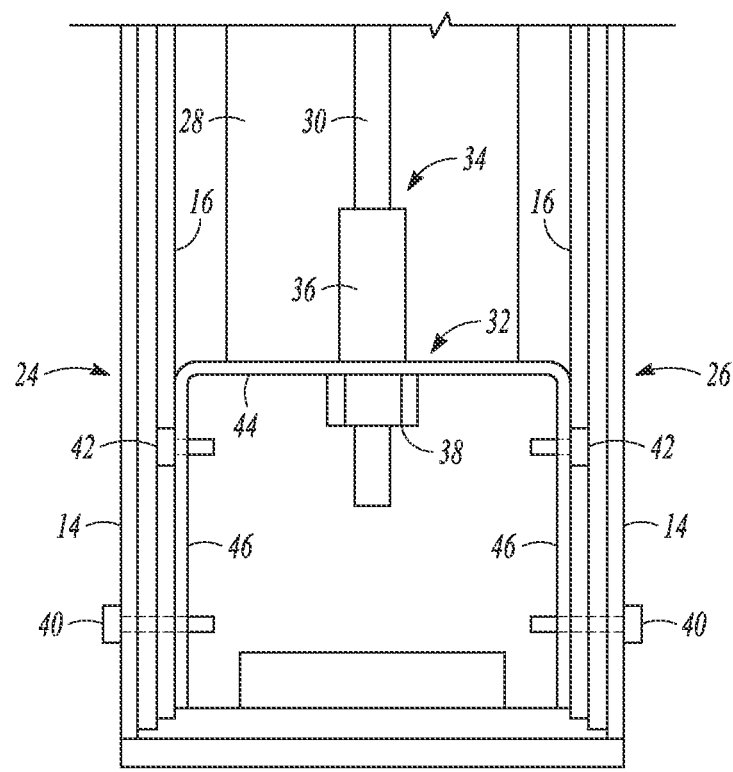
FIG. 6 is a close-up cross-sectional side view of the base portion of the example banner display system of FIGS. 1-3 taken along the line 6-6 in FIG. 3 showing details of the example base supporting member.

The banner display 12 shown in FIGS. 1-4 and 6 show a first example of a base member 32. In particular, the lower cutaway portion shown in FIG. 4 and the cross-sectional end view shown in FIG. 6 show details of the first example base member 32. As shown in FIGS. 2-4 and 6, the one or more cables 30 can pass through the interior space 28 of the banner display 12, which can, for example, be located between different structural members that make up the support cabinet 16 (best seen in FIGS. 4 and 6). In an example, the base member 32 is positioned at the bottom of the interior space 28, for example by being positioned between the structural members of the support cabinet 16. Each of the one or more cables 30 are mechanically connected to the base member 32 with one or more cable connecting structures 34. An example of the one or more cable connecting structures 34 includes, but is not limited to, a swage stud 36 or other structure for receiving the cable 30 and a nut 38 or other fastening structure that connects to the cable 30 and fastens the cable 30 to the base member 32.

The base member 32 is configured so that the base member 32 provides the primary support for the plurality of display modules 14 in the display 12. In an example, the base member 32 is coupled to one or more of the base display modules 14 so that the base member 32 supports the base display modules 14 against the pull of gravity. In the example, the base display modules 14 are coupled directly to the base member 32, such as with one or more fasteners 40. One or more fasteners can also couple the base member 32 to one or more of the structural members of the support cabinet 16, which can either be the same fasteners 40 as those used to couple the base display modules 14 to the base member 32, or can be entirely different fasteners 41. In another example, the base display modules 14 are indirectly coupled to the base member 32, for example via one or more intermediate mounting structures between the display modules 14 and the base member 32. For example, rather than directly connecting the base display modules 14 to the base member 32, the fasteners 40 can connect the base display modules 14 to one of the structural members of the support cabinet 16 or to another intermediate supporting member, which can be connected to the base member 32 with a second set of one or more fasteners 42.

The term "fasteners," when used herein, such as with the fasteners 40 or 42, refers to any fastening structure that can be used to connect one structure to another, either directly or indirectly. The specific fasteners used can depend on the structures being connected, the strength needed, and the preferences of the designer of the structures. Examples of structures that can be "fasteners" within the scope of the present disclosure include, but are not limited to, one or any combination of: one or more bolts (which can be used in conjunction with one or more washers or nuts or alone); one or more nails, pins or brads; one or more stables; one or more magnets; one or more clamps or clamping structures; one or more latches or latching structures; one or more adhesives; or one or more welds.

Figure 4:
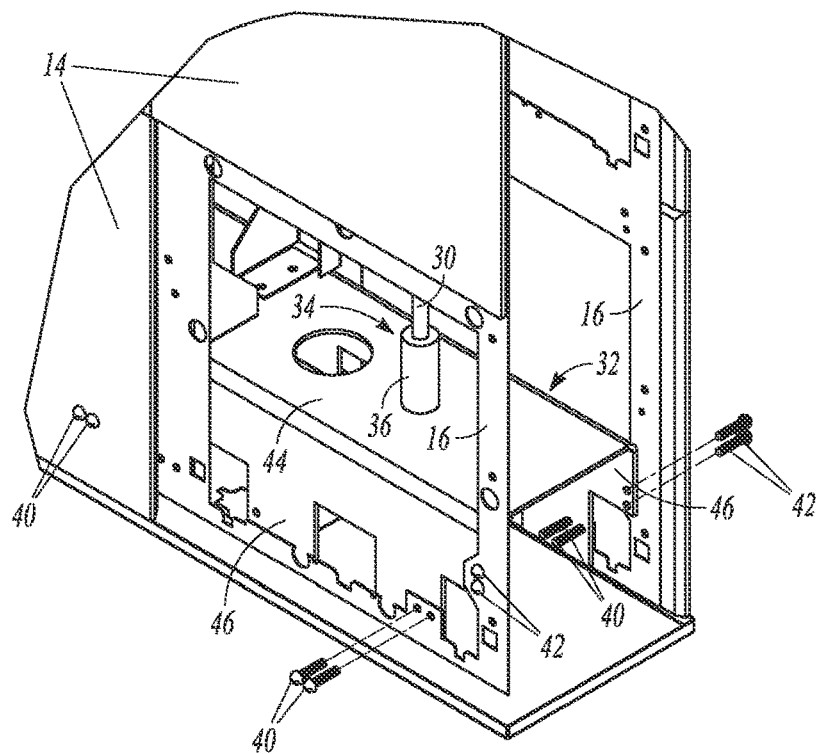
FIG. 4 is a close-up isometric cut-away view of a base portion of the example banner display system of FIGS. 1-3 taken along the line 4-4 in FIG. 2 showing details of an example base supporting member for supporting the display modules of the banner display system.

In the example best seen in FIGS. 4 and 6, the base member 32 is a generally U-shaped beam with a main section 44 that is oriented horizontally or substantially horizontally (referred to as the "main horizontal section 44") and a pair of side sections 46 that extend vertically or substantially vertically from the main horizontal section 44 (also referred to as "vertical side sections 46"). In an example, the one or more cables 30 are connected to the main horizontal section 44, such as with the swage stud 36 and the nut 38 as described above. In an example, the main horizontal section 44 and the vertical side sections 46 generally form a cross-sectional shape of an inverted letter U. In some examples, each of the main horizontal section 44 and the side sections 46 are planar or substantially planar such that the cross-sectional shape of the base member 32 is generally a substantially flat-sided U shape.

Figure 2:
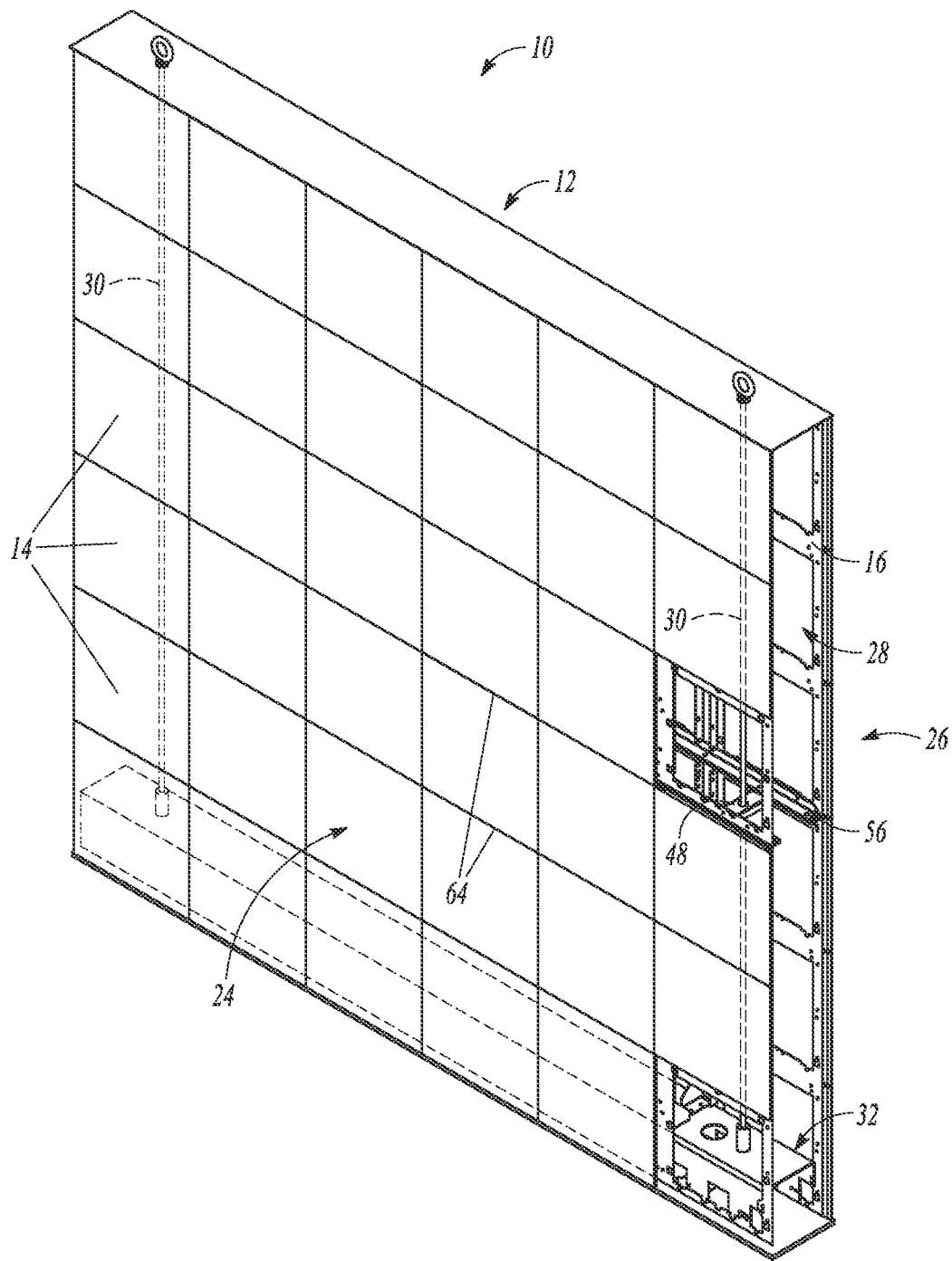
FIG. 2 is a partially cut-away isometric view of the example banner display system of FIG. 1.
Figure 3:
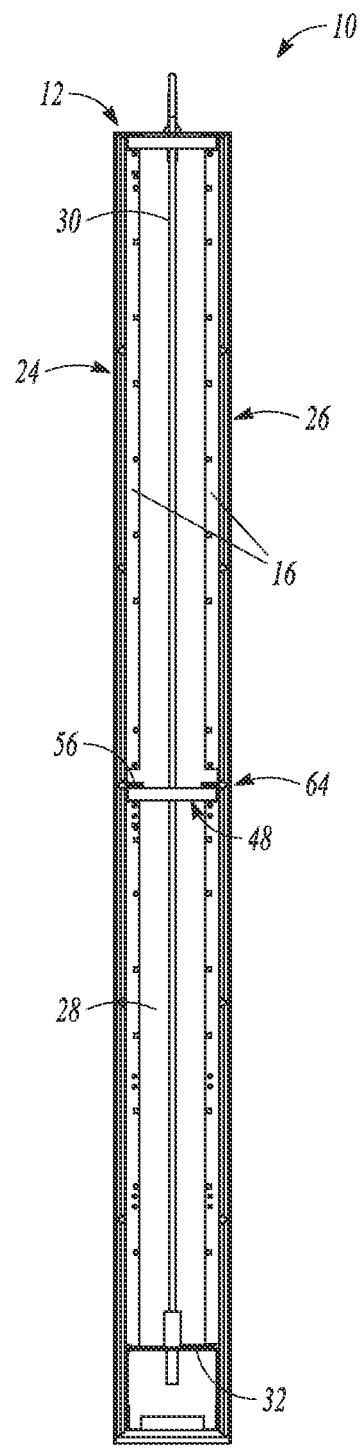
FIG. 3 is a cross-sectional side view of the example banner display system of FIGS. 1 and 2.

As is best seen in FIGS. 1 and 2, in an example, the banner display system 10 includes two cables 30, with each cable 30 being positioned proximate to a lateral end of the banner display 12, e.g., with a first cable 30 positioned proximate to the left end of the banner display 12 and a second cable 30 positioned proximate to the right end of the banner display 12 in the view of FIG. 1. In the example shown in FIGS. 1 and 2, both cables 30 are connected to the base member 32, e.g., with the first cable 30 connected proximate to the left end of the base member 32 and the second cable 30 connected proximate to the right end of the base member 32 in the view of FIG. 1. However, the banner display system 10 can include more than two cables 30 for supporting the base member 32. For example, a third cable could be included approximately at a lateral central point of the banner display 12 and that connects to the base member 32 generally at a center point along the length of the base member 32.

The base member 32 of the example banner display system 10 shown in FIGS. 1-7 and described above is a single base member 32 that extends substantially along substantially the entire width of the banner display 12 along the base of the banner display 12. However, a banner display system according to the present disclosure could include a plurality of base members that each extend across only a portion of the width of the banner display. For example, a banner display system could include a first base member that is connected to one or more first cables, wherein the first base member extends across a first portion of the width of the banner display and supports a first group of display modules. The same banner display system could also include a second base member that is connected to one or more second cables, wherein the second base member extends across a second portion of the width of the banner display and supports a second group of display modules. Additional base members can be added to the system depending on how the support of the display modules and the connection to the support structure via the cables is to be broken up. So long as each base member is sufficiently supported by one or more cables and is able to sufficiently support the display modules that it is designed to support, any number of base members can be used and still be within the scope of the present invention.

Figure 5:
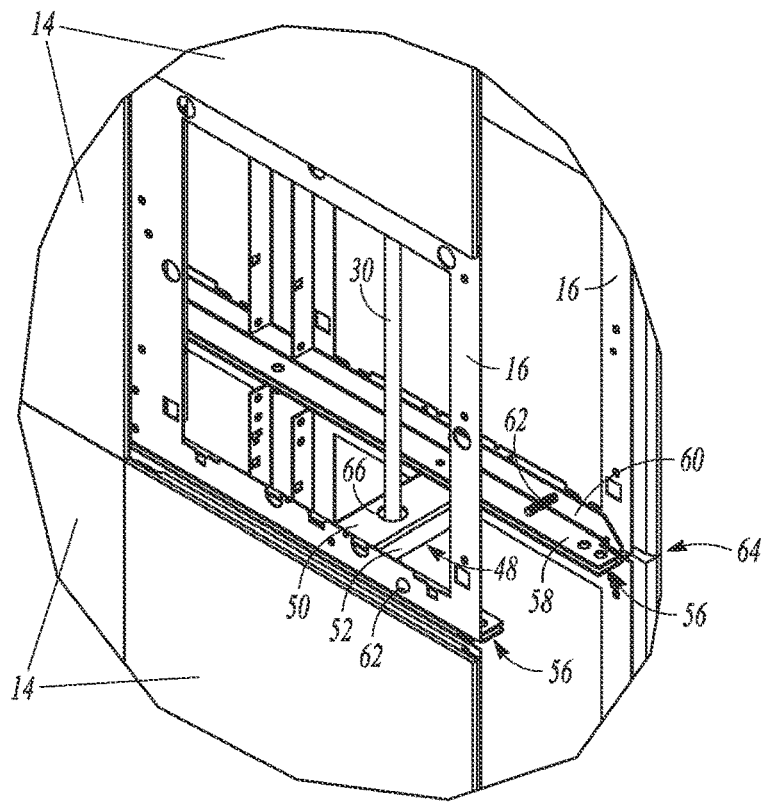
FIG. 5 is a close-up isometric cut-away view of a middle portion of the example banner display system of FIGS. 1-3 taken along the line 5-5 in FIG. 2 showing example intermediate support and alignment members for aligning and/or supporting the display modules of the banner display system.
Figure 7:
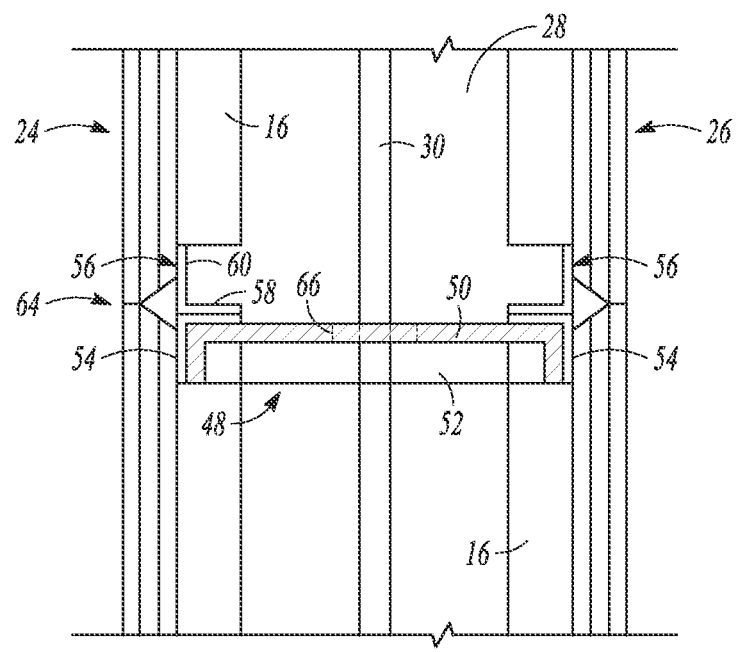
FIG. 7 is a close-up cross-sectional side view of the middle portion of the example banner display system of FIGS. 1-3 taken along line 7-7 in FIG. 3 showing details of the example intermediate support and alignment members.

The banner display system 10 can include structural components in addition to the one or more base members 32 to provide support or alignment, or both, for the display modules 14. For example, as is best seen in FIGS. 5 and 7, the banner display system 10 can include one or more intermediate alignment or support members 48, which will be referred to hereinafter as "intermediate member 48" or "intermediate members 48" for brevity. Each intermediate member 48 can perform one or more functions at the particular location for that intermediate member 48. The functions of the intermediate members 48 can include, but are not limited to:

a) guiding or aligning the one or more cables 30, e.g., so that each cable 30 is at a specified position and orientation relative to one or more of the display modules 14;

b) aligning one or more of the display modules 14 so that the one or more display modules 14 are at a specified orientation relative to one other, for example to ensure that the display surface created by the plurality of display modules 14 is substantially flat and oriented in a desired way (e.g., substantially vertical);

c) positioning one or more of the display modules 14 at a specified position relative to another one or more of the display modules 14, for example to provide a specified spacing between adjacent display modules 14 that form the same display (e.g., between adjacent display modules 14 in the front display surface 24), or to provide a specified spacing or positioning between the display modules 14 of one display and the display modules 14 of another display (e.g., to provide the spacing between the front display surface 24 and the rear display surface 26 to form the interior space 28 of the banner display 12); and d) supporting one or more of the display modules 14, for example to support one or more of the display modules 14 that are not one of the base display modules 14 that are supported by the base member 32.

A particular individual intermediate member 48 need not perform all of these functions. Rather, in some examples, a first set of the intermediate members 48 can perform a first set of one or more of the functions, a second set of the intermediate members 48 can perform a second set of one or more of the functions, and if necessary, third or third and fourth sets of the intermediate members 48 can perform a third or fourth set of the functions. For example, a first set of the intermediate members 48 can be designed to align and guide the one or more cables 30, a second set of the intermediate members 48 can be designed to align the display modules 14 in the specified alignment and relative orientation, a third set of the intermediate members 48 can be designed to position display modules 14 of the front display surface 24 relative to the display modules 14 of the rear display surface 26 and, optionally, a fourth set of the intermediate members can be designed to provide support to one or more of the display modules 14. In other words, each individual intermediate member 48 might perform less than all of the specified functions, but collectively all of the intermediate members 48 together will perform all of the functions specified for the intermediate members 48. In some examples, one or more of the intermediate members 48, and in some examples all of the intermediate members 48, performs all four of the functions specified above.

In the example shown in FIGS. 5 and 7, each intermediate member 48 is a generally U-shaped bar with a length in one direction that is substantially longer than its width in the other orthogonal directions (i.e., a length in the x-direction is substantially longer than the lengths in the y- and z-directions). In an example, the substantially-longer length direction of the intermediate member 48 is oriented to be generally orthogonal to the front display surface 24 and the rear display surface 26. In an example, the generally U-shaped intermediate member 48 includes a generally-horizontally oriented leg 50 (referred to as the "horizontal leg 50" for brevity), and one or more generally-vertically oriented legs 52 (referred to as "vertical legs 52" for brevity) that are coupled to the ends of the horizontal leg 50 and that extend orthogonally or substantially to the horizontal leg 50. In an example, the ends 54 of each intermediate member 48 (best seen in FIG. 7) are abutted against one or more display modules 14 or against a structural member of the support cabinet 16. In an example, the entirety or substantially the entirety of the U shape of each intermediate member end 54 is in the same plane and that plane is oriented in the direction that is desired for the display module 14 or the support cabinet 16 that is to be abutted against the end 54. In this way, the ends 50 of the intermediate member 48 act to align the display modules 14 of the front display surface 24 and the rear display surface 26 such that, in some examples, the horizontal leg 50 and the vertical legs 52 are substantially orthogonal to the display modules 14 of both the front display surface 24 and the rear display surface 26. The length of the intermediate member 48 acts to space the display modules 14 of the front display surface 24 from the display modules 14 of the rear display surface 26 in order to form the interior space 28.

As is further shown in FIGS. 5 and 7, in an example, the banner display system 10 can include one or more brackets 56 for each intermediate member 48. The brackets 56 can act in coordination with the intermediate members 48 to perform one or more of the functions described above. In the example best seen in FIGS. 5 and 7, the brackets 56 comprise generally L-shaped brackets 56 with a generally horizontally-oriented leg 58 ("horizontal leg 58") and a generally vertically-oriented leg 60 ("vertical leg 60") that is coupled to one end of the horizontal leg 58 and extends orthogonally or substantially orthogonally from the horizontal leg 58. The system can include a pair of the L-shaped brackets 56 for each intermediate member 48. In an example, the horizontal legs 58 of the L-shaped brackets 56 engage a top surface of the intermediate member 48, e.g., so that the horizontal leg 58 of one bracket 56 rests on top of the intermediate member 48 proximate to a first end 54 and the horizontal leg 58 of another bracket 56 rests on top of the intermediate member 48 proximate to the other end 54. The vertical legs 60 can abut against one or more display modules 14 or against a structural member of the support cabinet 16. In some examples the vertical legs 60 can be coupled to the structural member or a display module 14, or both, such as with one or more fasteners 62.

In an example, each intermediate member 48 and pair of brackets 56 are located at a position proximate to a horizontal seam 64 between two vertically-adjacent display modules 14 (best seen in FIGS. 5 and 7). The intermediate member 48 is positioned so that its ends 54 are abutted against the structural member of the support cabinet 16 proximate to an upper end of a lower display module 14 or against the lower display module 14 itself at its upper end, while the vertical leg 60 of the bracket 56 is abutted against the structural member proximate to a lower end of an upper display module 14 or against the upper display module 14 itself at its lower end. When the intermediate member 48 and the bracket 56 are in such an arrangement, the intermediate member 48 and the bracket 56 can act together to align both the lower display module 14 and the upper display module 14. In an example, the combination of an intermediate member 48 and a pair of the brackets 56 are positioned at least at every other horizontal seam 64 so that the intermediate members 48 and the brackets 56 can align all of the display modules 14 of the front display surface 24 and the rear display surface 26.

As described above, one function that the intermediate members 48 can perform is guiding a corresponding cable 30 and/or ensuring that the cable 30 is properly spaced away from the display modules 14 in the interior space 28. In an example, the intermediate member 48 defines a hole 66 through which the cable 30 can be fed. When the cable 30 passes through the hole 66, the sides of the bore surrounding the hole 66 can prevent the cable 30 from being able to substantially move over toward the display modules 14. In an example, the banner display system 10 includes a plurality of intermediate members 48 spaced vertically within the interior space 28 and each intermediate member 48 has a hole 66 for receiving the cable 30 so that the cable 30 is essentially held in place and is not able to move laterally, either side-to-side or front to back. The intermediate member 48 can optionally include one or more structures to engage and hold the cable 30 within the hole 66, such as a clamp or other fastener. In an example, a bushing or other intermediate structure can be positioned between the cable 30 and the sides of the hole 66 surrounding the cable 30 to prevent or minimize the cable 30 from rubbing against the intermediate member 48 and to prevent or minimize the cable 30 from being worn by the intermediate member 48, or vice versa, to prevent the intermediate member 48 from being worn by the cable 30.

Figure 8:
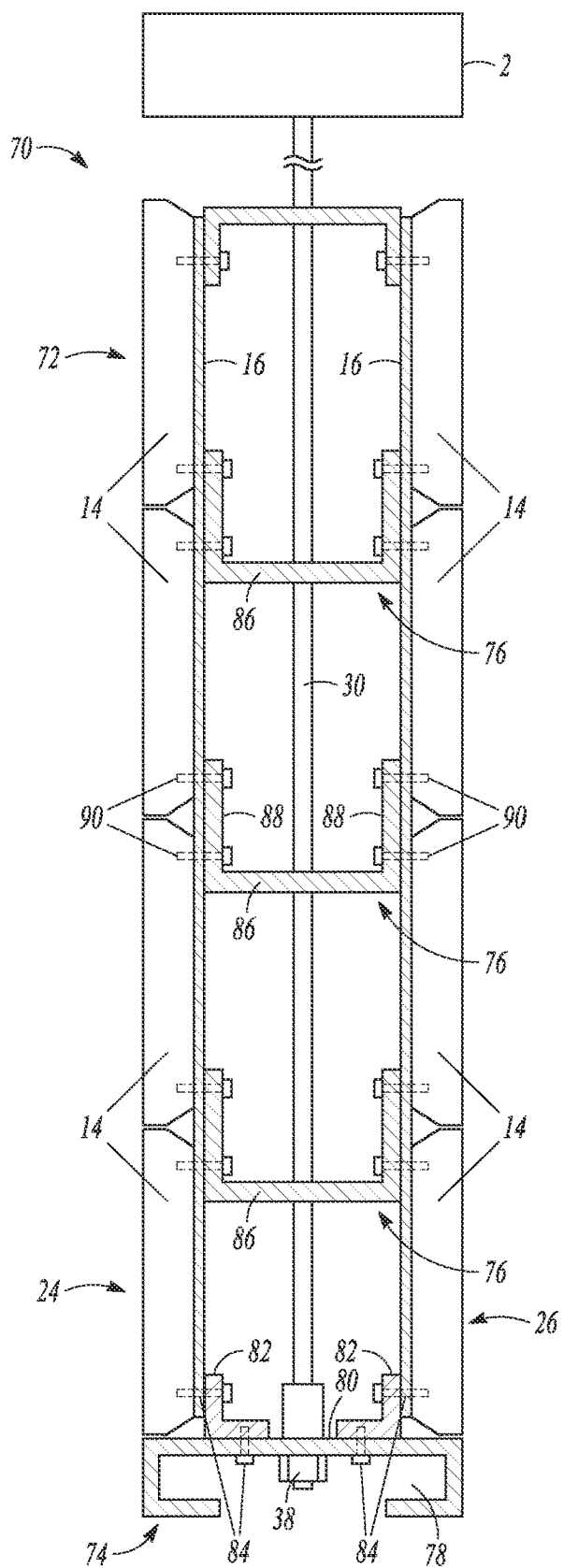
FIG. 8 is a cross-sectional side view of a second example banner display system with a second example of middle support members and a second example of a base supporting member.

The specific structures shown and described above for the base member 32 and the intermediate member 48, with or without the brackets 56, should not be considered limiting, and various alternatives can be contemplated that would perform the same functions as those of the specific base member 32, the specific intermediate member 48, and the specific brackets 56 described above. For example, FIG. 8 shows an alternative banner display system 70 that includes many of the same features as the banner display system 10 described above with respect to FIGS. 1-7 and, therefore, structures that are similar in the banner display system 70 to those in the banner display system 10 are given the same or similar reference numbers as those used in FIGS. 1-7. For example, the banner display system 70 also comprises a banner display 72 comprising a plurality of display modules 14, a support cabinet 16, an interior space 28 between a front display surface 24 made up of a first set of the display modules 14 and a rear display surface 26 made up of a second set of the display modules 14, and one or more tension members 30 (e.g., cables 30) that support the banner display 12 from a support structure 2.

The banner display system 70 of FIG. 8 includes an alternative example design of a primary support member 74, also referred to as a base supporting member 74 or base member 74, and an alternative example design of an intermediate alignment or support member 76, also referred to as an intermediate member 76. In an example, the base member 74 in FIG. 8 performs the same functions as the base member 32 shown in FIGS. 1-4 and 6, that is, connecting to the one or more cables 30 to support the banner display 72 from the support structure 2 and supporting the plurality of display modules 14 from the base of the banner display 72 so as to avoid or minimize the formation of visible seams due to gravity separation over time. The second example base member 74 has a different design from that of the base member 32 and connects to and support the base display modules 14 in a different way than the base member 32.

As can be seen in FIG. 8, in an example, the base member 74 comprises a shaped beam that forms a simple channel 78, such as a generally D-shaped beam or girder. The base member 74 includes a generally flat upper surface 80, and in some examples the upper surface 80 extends through the entire or substantially the entire depth of the banner display 72 (e.g., left-to-right as shown in FIG. 8) so that the base display modules 14 physically rest on the upper surface 80. In some examples, the support cabinet 16 also rests on the upper surface 80 or is positioned above the base member 74. The upper surface 80 of the base member 74 can also act as a bottom boundary to the interior space 28 within the banner display 72. In this way, the base member 74 is positioned below a front display surface 24 and the rear display surface 26 and supports both. This differs from the base member 32 shown in FIGS. 2-4 and 6, where the base member 32 is positioned within the interior space 28 and between the structural members of the support cabinet 16 and also between the front display surface 24 and the rear display surface 26. The base member 74 also directly supports the base display modules 14 which rest on the upper surface 80, while the base member 32 supports the base display modules 14 of the banner display 12 through the connected between the base member 32 and the base display modules 14 (i.e., with the fasteners 40 and/or the fasteners 42).

The banner display system 70 can also include one or more brackets 82 or other mounting hardware that can be used to couple the base member 74 to one or both of the support cabinet 16 and the base display modules 14. In the example shown in FIG. 8, the brackets 82 each comprise an L-shaped structure, similar to the brackets 56 that can be used with the intermediate member 48 in the banner display system 10 of FIGS. 1-7. The brackets 82 can align the base member 74 relative to the cable 30 and relative to the display modules 14. In an example, the brackets 82 are connected to one or more of the base member 74, the support cabinet 16, or to one or more of the base display modules 14, such as with fasteners 84.

The example banner display system 70 shown in FIG. 8 also includes one or more of a second example intermediate member 76. In an example, the intermediate member 76 of FIG. 8 performs one or more of the same functions described above for the intermediate members 48 and the brackets 56 in the banner display system 10 of FIGS. 1-7, such as one or more of: guiding or aligning the one or more cables 30; aligning one or more of the display modules 14 so that they are at specified orientation relative to one another; positioning one or more of the display modules 14 relative to another one or more of the display modules 14 (e.g., the positioning of display modules 14 within the same display, such as in the front display surface 24, or positioning of display modules 14 in one display relative to those in another display, e.g., those in the front display surface 24 relative to those in the rear display surface 26); or supporting one or more of the display modules 14.

Despite providing one or more of the same functions, the intermediate member 76 shown in FIG. 8 has a different structural design from the intermediate member 48 and the brackets 56 in the banner display system 10. In an example, the banner display system 70 of FIG. 8 only includes one kind of intermediate member 76, rather than in the banner display system 10 of FIGS. 1-7, which includes both the intermediate members 48 and the brackets 56. The one or more intermediate members 76 in FIG. 8 also have a generally U-shaped cross section, but are oriented as a normally-oriented U rather than the inverted U-shape of the intermediate members 48 in the banner display system 10. Like the intermediate members 48, the one or more intermediate members 76 include a generally-horizontally oriented leg 86 (referred to as a "horizontal leg 86" for brevity) and a pair of generally-vertically oriented legs 88 (referred to as "vertical legs 88" for brevity) that are coupled to the ends of the horizontal leg 86 and that extend orthogonally or substantially orthogonally from the horizontal leg 86. However, unlike the intermediate member 48, where both its horizontal leg 50 and its vertical legs 52 are orthogonal or substantially orthogonal to the display modules 14 of the front display surface 24 and the rear display surface 26, the vertical legs 88 of the intermediate member 76 are parallel or substantially parallel to the display modules 14 of the front display surface 24 and the rear display surface 26. The vertical legs 88 of the intermediate member 76 can also be abutted against the display modules 14 or against the support cabinet 16. In this way, the vertical legs 88 of the intermediate member 76 can align the display modules 14 in a specified alignment within one or both of the front display surface 24 and the rear display surface 26, while the length of the horizontal leg 86 acts to keep the display modules 14 of the front display surface 24 spaced from the display modules 14 of the rear display surface 26 to form the interior space 28 within the banner display 72. In an example, the intermediate members 76 can be connected to one or both of the support cabinet 16 and one or more display modules 14, such as with one or more fasteners 90 or some other connecting structure or means.

FIGS. 9A-9E show several other examples of alternative designs of one or more base members that can be used in place of or in addition to the designs of the base members 32 and 74 described above. For example, the example banner display system 92 shown in FIG. 9A comprises a base member 94 that is a simple tube, such as a tube having a rectangular or substantially rectangular cross section. Like the base member 74 shown in FIG. 8, the base member 94 has a substantially flat upper surface 96 that can span substantially the entire depth of the banner display 92 (e.g., left-to-right in FIG. 9A) and can directly support the base display modules 14 that form the banner display 92 from underneath.

Figure 9A:
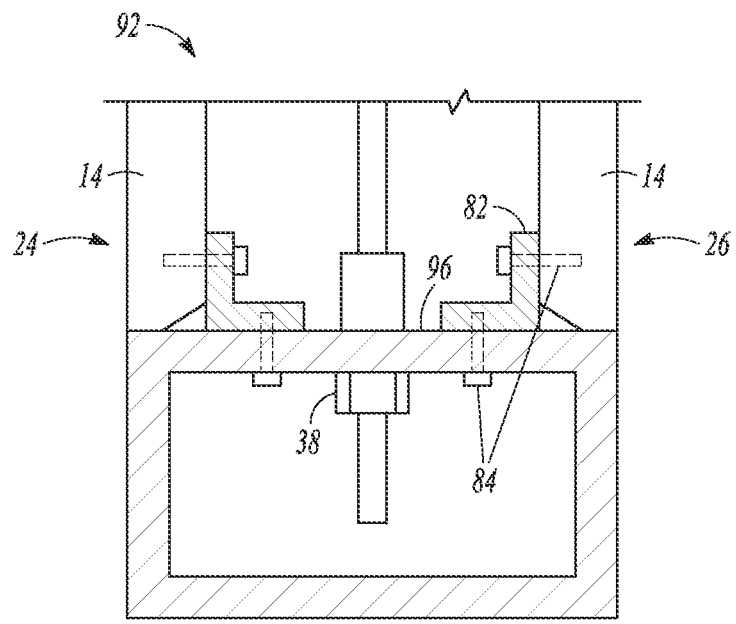
FIGS. 9A-9E show alternative examples of base supporting members for use in a banner display.

In an example, the example base member 74 of FIG. 8 and the example base member 94 in FIG. 9A can be made from stock, non-specialized beams having a width that substantially corresponds to the desired depth of the banner display 72 or 92 and that is simply cut to a specified length for the base member 74 or 94.

Figure 9B:
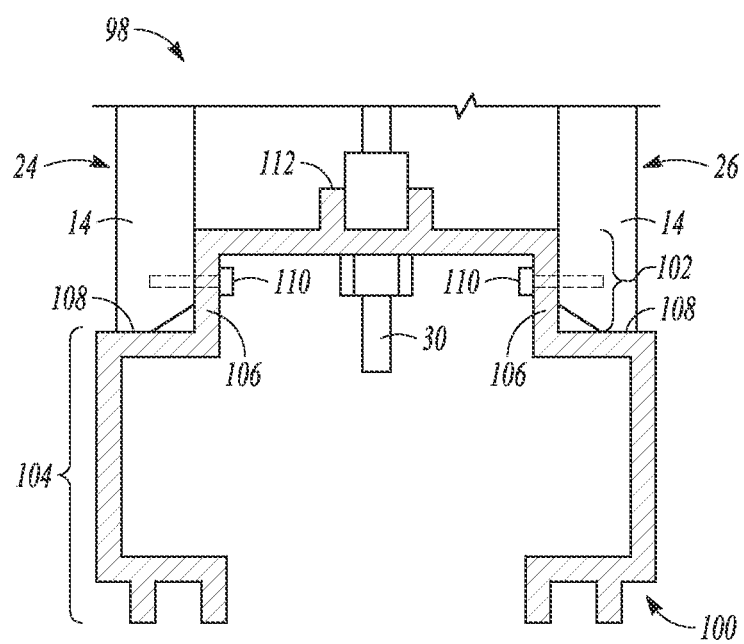

FIG. 9B shows an example banner display system 98 that includes an example base member 100 comprising a more complex cross-sectional shape. In an example, the base member 100 can be an extruded support structure that is extruded through a die with an extrusion gate that matches or substantially matches the cross-sectional shape of the base member 100. In such an example, the base member 100 can be formed by extruding an extrudable material, such as an extrudable aluminum, steel, titanium, or polymer of sufficient strength, through the die to the specified length of the base member 100. Further processing of the extruded base member 100 may also be performed, such as cutting, smoothing, or coating. In an example, the extrusion die that forms the base member 100 can be specifically designed for the banner display 98.

In the example shown in FIG. 9B, the extruded base member 100 includes an upper portion 102 that is sized to fit between the base display modules 14 of a front display surface 24 and the base display modules 14 of a rear display surface 26, but a lower portion 104 that is wider so that the lower portion 104 can directly support the base display modules 14. In this example, the upper portion 102 can act to align the base display modules 14 and space the base display module 14 of the front display surface 24 at the specified distance from the base display module 14 of the rear display surface 26, for example by abutting the rear surfaces of the base display modules 14 against the side walls 106 of the upper portion 102. At the same time, an upper surface 108 of the lower portion 104 can support the base display modules 14, which in turn provides support to the other display modules of the front and rear display surfaces 24, 26. In an example, the extruded base member 100 is connected to the base display modules 14, such as with one or more fasteners 110 that connect the base display modules 14 to the side walls 106 of the upper portion 102 (as shown in FIG. 9B), or that connect the base display modules 14 to the base member 100 through the upper surface 108 of the lower portion 104 (not shown).

In example, the extruded base member 100 can include one or more additional extruded structures for connecting the one or more cables 30 to the base member 100. For example, as shown in FIG. 9B, the base member 100 can include a channel 112 extruded into the top of the base member 100, such as on top of the upper portion 102, where the channel 112 receives and positions the cable 30 relative to the base member 100. In this way, the channel 112 can act similar to the swage stud 36 that is used as part of the connection between a cable 30 and the base member 32, as is best seen in FIGS. 4 and 6.

Figure 9C:
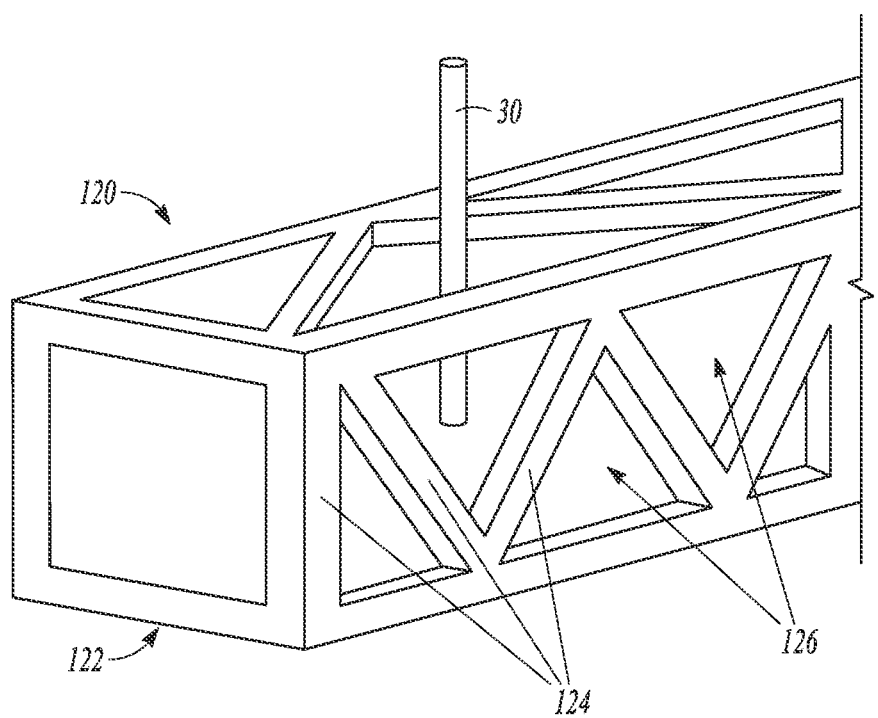

FIG. 9C shows a perspective view of another example base member 120 that comprises a truss assembly 122. The truss assembly 122 includes a plurality of truss members 124 arranged in a geometrical pattern that can provide structural integrity to the base member 120 so that the base members is sufficiently strong to support one or more of the display modules 14 in a banner display. For example, the truss members 124 can be substantially straight members made from a sufficiently strong material, such as steel or aluminum, and the truss members 124 can be arranged to form triangular or substantially triangular supporting cells 126 along one or more dimensions of the base member 120. As is known, forming triangular or substantially triangular supporting cells, such as in the supporting cells 126 shown in FIG. 9C, can provide good structural strength and rigidity in multiple dimensions of a truss structure. The formation of the supporting cells 126 can also leave several openings through which the one or more cables 30 and a mounting structure can be inserted for easy mounting or connection of a cable 30 to the base member 120. For example, as shown in FIG. 9C, a cable 30 can be extended through an opening formed between truss members 124 of a supporting cell 126. The cable 30 can be connected to the base member 120 by connecting the cable 30 to one of the truss members 124, or by including a mating structure (not shown) that the cable 30 is connected to (such as by inserting the cable 30 into the mating structure) and also connected the mating structure to the base member 120. In an example, the mating structure can have an overall shape that substantially matches the shape of one of the supporting cells 126 formed by the truss members 124 so that the mating structure can tightly and securely fit within the supporting cell 126.

The one or more base members 74, 94, 100, and 120 can be connected to the one or more cables 30 via any structure capable of providing a sufficient and secure connection between the base member 74, 94, 100, or 120 and the cable 30, including, but not limited to, a clamp, fastener, welding, or the like. In the examples shown in FIGS. 8, 9A, and 9B, the base members 74, 94, and 100 are coupled to the one or more cables 30 with a nut 38, similar or identical to the nut 38 that connects the cable 30 to the base member 32. FIG. 9C does not show the base member 120 connected to the cable 30, but a person of ordinary skill in the art will be able to readily envision structures and methods to do so without varying from the scope of the present invention.

Figure 9D:
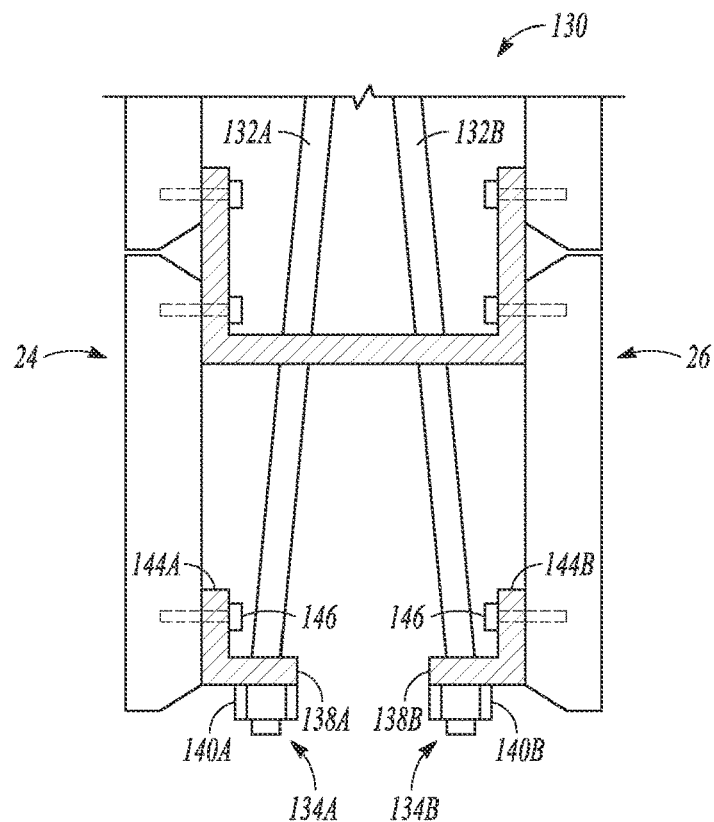
Figure 9E:
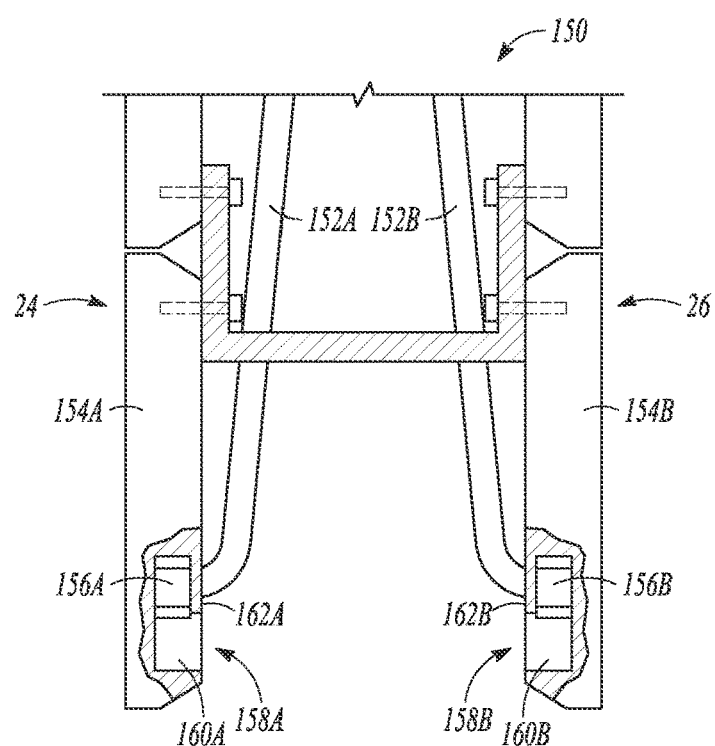

FIGS. 9D and 9E show additional examples of banner display systems where the one or more base members that the one or more cables connect to include relatively minimal structure, while still providing for sufficient structure to connect the cables to the base display modules 14. In the example banner display systems of FIGS. 9D and 9E, the cables are also more directly connected to a corresponding display module 14, rather than being more directly connected to a base member (such as base member 32, 74, 94, 100, or 120 described above). In the banner display systems shown in both FIG. 9D and FIG. 9E, at each lateral point of connection to the base display modules 14, at least a pair of cables are included, with a first cable being connected to a base display module 14 of the front display surface 24 and a second cable being connected to a base display module 14 of the rear display surface 26.

FIG. 9D shows an example banner display system 130 that includes a pair of cables 132A, 132B at a particular lateral connection point within the banner display system 130. In an example, a first of the cables 132A is connected to a corresponding base display module 14 of the front display surface 24 and a second of the cables 132B is connected to a corresponding base display module 14 of the rear display surface 26. Each of the cables 132A, 132B is connected to a corresponding bracket 134A, 132B, which is then connected to a corresponding base display module 14. In this way, each bracket 134A, 134B is, in essence, acting as a base supporting member similar to the base members 32, 74, 94, 100, and 120 described above. Each cable 132A, 132B can be connected to its respective bracket 134 by any connecting structure capable of providing a secure connection between the cable 132A, 132B and the bracket 134A, 132B. In the example shown in FIG. 9D, the cables 132A, 132B are inserted through a hole in a horizontally- or substantially horizontally-oriented leg 138A, 138B of each bracket 134A, 132B (referred to as the "horizontal leg 138A, 138B" for brevity). In an example, a corresponding nut 140A, 140BB is connected onto each cable 132A, 132B (or some other structure that is wider than the cable 132A, 132B). The nut 140A, 140B is wider than the holes through the horizontal legs 138A, 138B so that the cable 132A, 132B will not slide out of the hole. The bracket 134A, 132B can be connected to the corresponding base display module 14 with any connecting structure, such as one or more fasteners 142 that are inserted through the bracket 134A, 132B, such as with fasteners 146 through a vertically- or substantially vertically-oriented leg 144A, 144B ("vertical leg 144A, 144B") and into the corresponding base display module 14.

The banner display system 150 of FIG. 9E also includes a pair of cables 152A, 152B at a lateral connection point, but each cable 152A, 152B in the banner display system 150 is more directly coupled to a corresponding base display module 154A, 154B than the cables 132A, 132B in the banner display system 130. The coupling between each cable 152A, 152B and the corresponding base display module 154A, 154B can be via any structure that will provide for sufficient securing between the cable 152A, 152B and the corresponding base display module 154A, 154B. In some examples, the structure for coupling the cables 152A, 152B to the corresponding base display modules 154A, 154B is easy to install and uninstall. In an example, each cable 152A, 152B includes a tab 156A, 156B proximate to a distal end of the cable 152A, 152B, wherein the tab 156A, 156B has an expanded width or diameter relative to the width or diameter of the rest of the cable 152A, 152B. In some examples, the tab 156A, 156B can be another structure that is connected to the cable 152A, 152B, similar to the nuts 140A, 140B that are connected to the cables 132A, 132B in the banner display system 130 of FIG. 9D, or the tab 156A, 156B can be a structure that is integral with the rest of the cable 152A, 152B, such as by bending, crimping, or otherwise modifying the cable 152 so that it has an expanded width. Each tab 156A, 156B can be inserted into a corresponding slot 158A, 158B that is located on or in the corresponding display module 154A, 154B. In an example, each slot 158A, 158B includes an ingress opening 160A, 160B that is large enough to receive the entirety of the corresponding tab 156A, 156B, and a narrowed section 162A, 162B that is wider than the width or diameter of the main portion of the cables 152A, 152B, but narrower than the tabs 156A, 156B so that a tab 156A, 156B will not be pulled out from its corresponding slot 158A, 158B unless the tab 156A, 156B is first manually slid to the ingress openings 160A, 160B so that the tab 156A, 156B, and thus the cable 152A, 152B, can be pulled out of disengagement with the slot 158A, 158B. When the tabs 156A, 156B are inserted into the slots 158A, 158B, the tabs 156A, 156B engage with the slot 158A, 158B in order to support the corresponding display module 154A, 154B. In this way, each tab 156A, 156B is, in essence, acting as a base supporting member similar to the base members 32, 74, 94, 100, 120, and 134 described above.

Figure 10A:
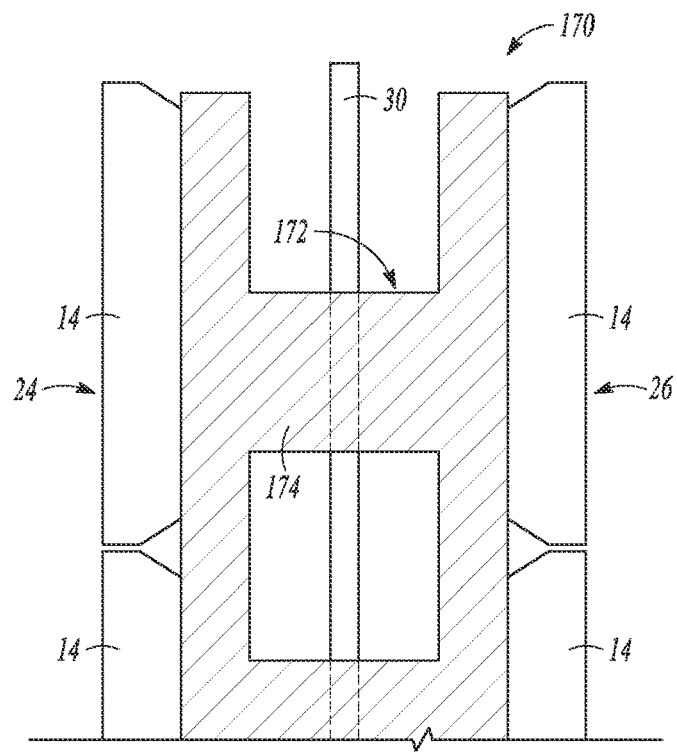
FIGS. 10A-10C show alternative examples of intermediate supporting members for use in a banner display.
Figure 10B:
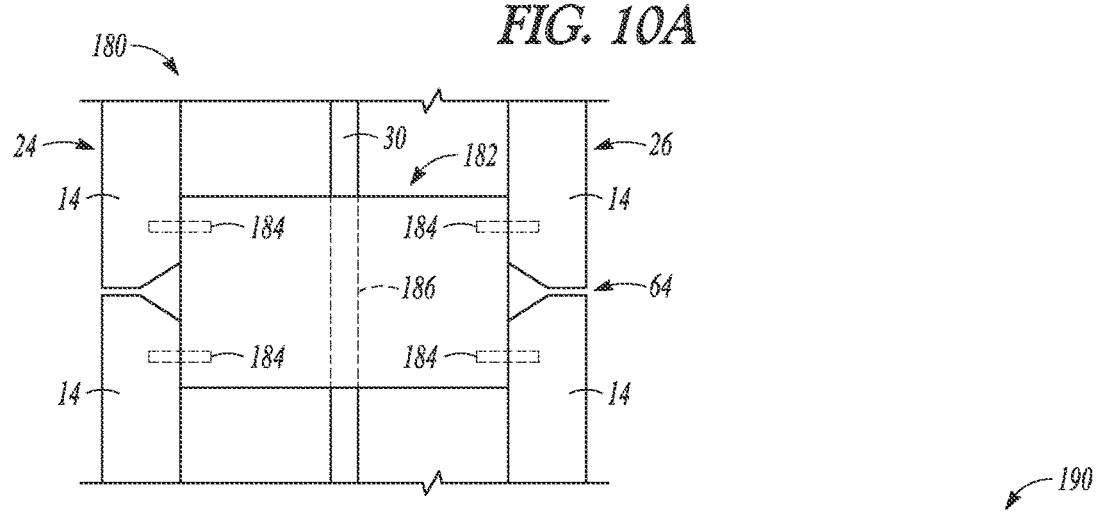
Figure 10C:
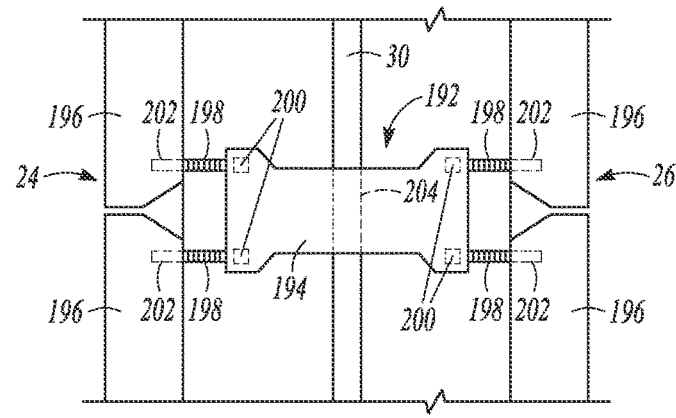

FIGS. 10A-10C show several other examples of alternative designs of one or intermediate members that can be used in place of or in addition to the designs of the intermediate members 48 and 76 described above. FIG. 10A shows a portion of an example banner display system 170 with an intermediate member 172 that comprises one or more preformed frames 174 that are placed in the interior space 28 between the front display surface 24 and the rear display surface 26. The display modules 14 of the banner display system 170 can be abutted against the one or more 174, which can provide for a specified alignment for the display modules 14 of the front display surface 24 and the rear display surface 26. The display modules 14 can also be connected to the one or more frames 174, such as with fasteners or other connecting structures (not shown). The dimensions of the one or more frames 174 can act to space the display modules 14 of the front display surface 24 from those of the rear display surface 26 at a specified distance. The one or more frames 174 can also be arranged within the interior space 28 in order to leave sufficient space for one or more cables 30 to extend downward through the interior space 28 so that the one or more cables 30 can pass through the intermediate member 172 in order to support a base supporting member, such as one of the example base supporting members 32, 74, 94, 100, 134, and 156 described above.

FIG. 10B shows a portion of another example banner display system 180 that includes another alternative intermediate member 182. The intermediate member 182 comprises a solid or substantially solid block of material of sufficient depth, height, and width to provide aligning surfaces for the display modules 14. In an example, one or more of the intermediate members 182 can be positioned proximate to a horizontal seam 64 of the front display surface 24 and the rear display surface 26, and the block that forms the intermediate member 182 can be connected to one or more of the display modules 14 in each of the front display surface 24 and the rear display surface 26, such as with one or more fasteners 184 other connecting structures. A bore 186 can be formed through the block of the intermediate member 182 that can receive one or more cables 30 so that the one or more cables 30 can pass through the intermediate member 182 in order to support a base supporting member, such as one of the example base supporting members 32, 74, 94, 100, 134, and 156 described above.

FIG. 10C shows a portion of another example banner display system 190 that includes another alternative intermediate member 192. The intermediate member 192 comprises a base structure 194 that is connected to one or more display modules 196 in a front display surface 24 and a rear display surface 26 with a set of threaded rods 198. In an example, each threaded rod 198 engages a corresponding threaded opening 200 in the base structure 194 at one end and engages a corresponding threaded opening 202 on or in a corresponding display module 196 at its other end. The threaded rods 198 are rotated so that they are inserted by a specified distance into the threaded openings 200 in the base structure 194 and the threaded openings 202 in the display modules 196 such that the display modules 196 are spaced by a specified distance between the front display surface 24 and the rear display surface 26 and so that the display module 196 are aligned in a desired alignment relative to each other. A bore 204 can be formed through the base structure 194 that can receive one or more cables 30 so that the one or more cables 30 can pass through the base structure 194 of the intermediate member 192 in order to support a base supporting member, such as one of the example base supporting members 32, 74, 94, 100, 134, and 156 described above.

Figure 11A:
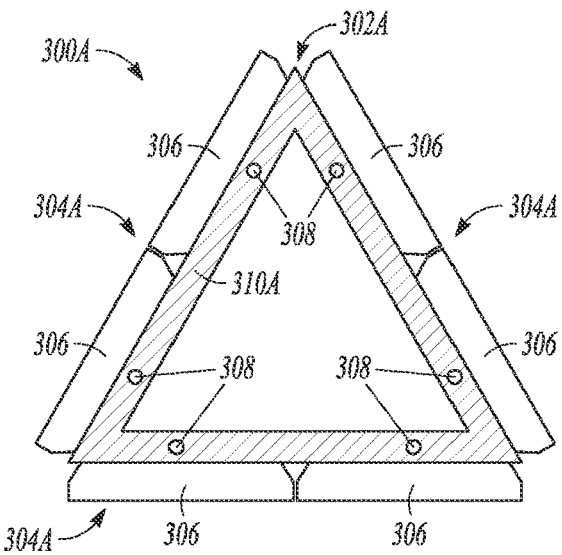
FIGS. 11A-11C are a cross-sectional top views of other example banner displays with each banner display having a different cross-sectional shape
Figure 11B:
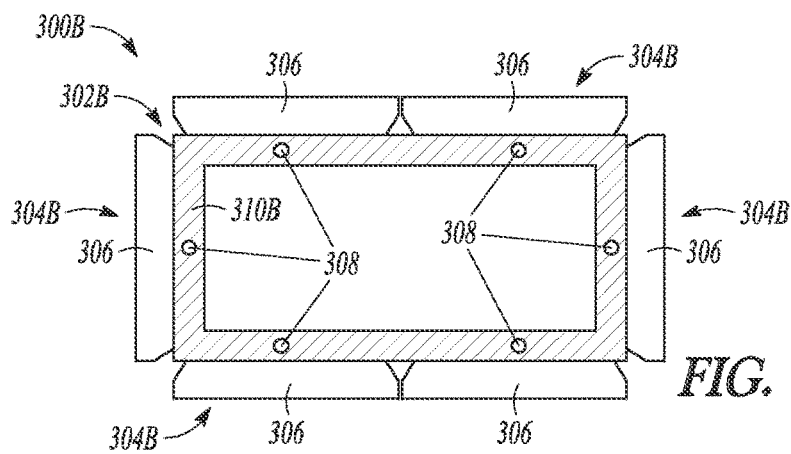
Figure 11C:
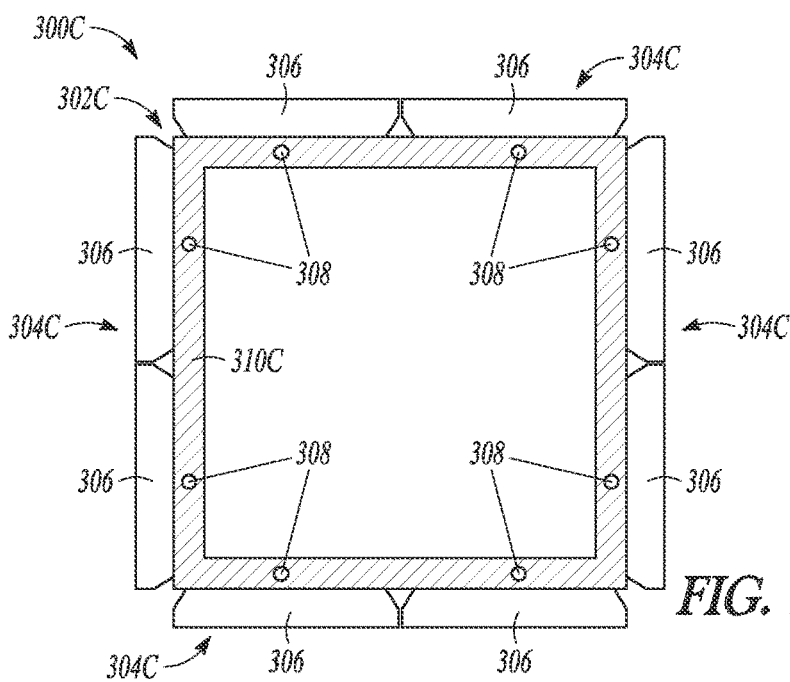

Although each of the example banner display systems described up until this point have all included a basic two-sided banner display with generally opposed displays, such as the front display surface 24 and the rear display surface 26 described with respect to the banner display systems 10, 70, 92, 98, 130, 150, 170, 180, and 190, a banner display in accordance with the present disclosure can include other overall geometries, including more or fewer display screens than the front and rear display surfaces 24, 26 described above. FIGS. 11A-11C show three other examples of banner display systems 300 each comprising more than the two display surfaces 24, 26 described above with respect to banner display systems 10, 70, 92, 98, 130, 150, 170, 180, and 190.

For example, FIG. 11A shows a top cross-sectional view of an example banner display system 300A comprising a triangular (that is, a three-sided) display 302A formed by three display surfaces 304A and with one or more display modules 306 forming each display surface 304A. For example, each display surface 304A of the display 302A comprises an array of the display module 306 that are two display modules 306 wide. The number of display module 306 in the vertical direction (e.g., in the direction that is into and out of the view shown in FIG. 11A) is unknown, but could be any number of displays that can be practically supported by the support structures described herein.

FIG. 11B shows a top view of a banner display system 300B comprising a generally rectangular (that is, four-sided) display 302B formed by four display surfaces 304B. Each display surface 304B comprises one or more display modules 306. In the example banner display system 300B show in in FIG. 11B, the display surfaces 304B in one direction are larger than display surfaces 304B in another direction. For example, the top and bottom display surfaces 304B in FIG. 11B (which are depicted as comprising a display surface 304B that are two display module 306 wide, are longer in their lateral direction (i.e., left-to-right in FIG. 11B, than the left and right display surfaces 304B are wide in their lateral direction (i.e., up and down in FIG. 11B), e.g., because the top and bottom display surfaces 304B are depicted as being formed by an array that is two display module 306 wide while the left and right display surfaces 304B are depicted as being formed by an array that is only one display module 306 wide. Like the display 302A of the banner display system 300A in FIG. 11A, the display surfaces 304B in the display 302B can include any number of display module 306 in the vertical direction (i.e., into and out of the view shown in FIG. 11B).

FIG. 11C shows a top view of a banner display system 300C that is similar to the banner display system 300B shown in FIG. 11B in that the banner display system 300C also comprising a display 302C having four sides that is formed by four display surfaces 304C, with each display surface 304C comprising one or more display modules 306. However, the example banner display system 300C comprises a generally-square shaped display 302B where all four display surfaces 304C have substantially the same width because the width of each display surface 304C includes the same number of display modules 306 (e.g., each display surface 304C in FIG. 11C is formed by an array that is two display modules 306 wide. Like the display 302A in FIG. 11A and the display 302B in FIG. 11B, the display surfaces 304C in the display 302C can include any number of display module 306 in the vertical direction (i.e., into and out of the view shown in FIG. 11C).

As shown in FIGS. 11A-11C, each banner display system 300A, 300B, 300C is supported by one or more tension members 308 that are coupled to one or more support structures (such as the support structure 2 shown in FIG. 1). As with the banner display systems 10, 70, 92, 98, 130, 150, 170, 180, and 190 described above, any type of tension member can be used that is conducive to the other supporting structures described herein (e.g., one or more base supporting member, and in some examples one or more intermediate members), but as with the tension members 30 described above, in some examples, one or more cables are preferred. In the examples shown in FIGS. 11A-11C, two cables 308 are included on each side of the display 302A, 302B, 302C, e.g., with two cables 308 being proximate to each display surface 304A, 304B, 304C. In an example, the cables 308 can pass through a support cabinet 310A, 310B, 310C. In some examples, the display modules 306 can be mounted to the support cabinet 310A, 310B, 310C of each display 302A, 302B, 302C, for example to ensure a specified alignment of the display module 306 relative to one another, both within a corresponding display surface 304A, 304B, 304C and between display module 306 of different display surfaces 304A, 304B, 304C within the same display 302A, 302B, 302C.

In an example, a banner display system 300A, 300B, 300C can include one or more structures within the support cabinet 310A, 310B, 310C that can guide or align the one or more cables 308, such as one or more intermediate members within the support cabinet 310A, 310B, 310C that a cable 308 may pass through as it passes through the support cabinet 310. In example, the one or more cables 308 of each banner display system 300A, 300B, 300C extend through the support cabinets 310A, 310B, 310C so that the cables 308 can reach one or more base supporting members (not shown in FIGS. 11A-11C). Like the base members 32, 74, 94, 100, 120, 134, 156 described above, the one or more base supporting members of each banner display system 300A, 300B, 300C provides underlying support for one or more display module 306 in the display 302A, 302B, 302C, which, as described above, can prevent or reduce the formation of visual seams in the display surfaces 304A, 304B, 304C over time due to gravity pulling the display modules 306 apart. The base supporting members of the banner display systems 300A, 300B, 300C can have any of the configurations described above with respect to base members 32, 74, 94, 100, 120, 134, 156. However, those of skill in the art will recognize that some modification of one or more of the specific structures of a particular base member 32, 74, 94, 100, 120, 134, or 156 may be made to accommodate the particular geometry, structural requirements, and supporting requirements of the particular display 302A, 302B, 302C being supported by the cables 308 and the base supporting member.

The banner display systems 300A, 300B, and 300C shown in FIGS. 11A-11C, as well as the banner display systems 10, 70, 92, 98, 130, 150, 170, 180, and 190 shown in FIGS. 1-8, 9A, 9B, 9D, 9E, and 10A-10C, are intended to demonstrate that the geometry of a display that is supported by the cables 30, 132, 152, or 308 from a support structure is not limiting, so long as the cables, the support structure, the one or more base supporting members, and in some examples, the one or more intermediate members, are sufficient to support the weight of the banner display. However, no other aspect of the specific banner display systems or displays shown in or described with respect to the figures should be construed as limiting unless that aspect is necessary for the operation of the support structures (e.g., the one or more cables, the one or more base supporting members, and in some examples the one or more intermediate members).

For example, each of the displays shown in the figures is depicted as having a generally symmetrical cross-sectional shape. The banner displays shown in FIGS. 1-8, 9A, 9B, 9D, 9E, and 10A-1C are all depicted as two-sided displays with front display surfaces and rear display surfaces that are substantially identical (i.e., comprising the same number of display modules arranged in the same number of rows and columns) but facing in opposing directions. Similarly, the display 302A is shown as an equilateral triangle in FIG. 11A, the display 302B is shown as a regular rectangle in FIG. 11B, and the display 302C is shown as a square in FIG. 11C. However the cables, base supporting members, and in some examples intermediate members described herein can also be used with non-symmetrical displays. In addition, each of the display surfaces depicted in the figures are shown or described as being generally rectangular in shape and as being made up of display modules having generally rectangular faces. However, the cables, base supporting members, and in some examples intermediate members described herein can also be employed to support a display with one or more non-rectangular shaped display surfaces that may or may not include non-rectangular shaped display modules. Finally, each of the displays shown and described herein are depicted as forming flat or substantially flat display surfaces, i.e., with the LEDs or other light-emitting elements in the display surfaces being aligned or substantially aligned in the same plane so that the display surfaces appear to be planar or substantially planar to a viewer. However, the cables, base supporting members, and in some examples intermediate members described herein can also be employed in displays that form non-planar surfaces, such as curved displays (either regularly curved displays or irregularly curved displays with or without generally planar portions) or displays that give the appearance of curvature via the use of a plurality of planar or substantially planar display modules that are arranged and angles relative to one another to give the appearance of a curved shape.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A display system comprising:
   a display comprising a display surface formed from a plurality of vertically adjacent module rows each comprising one or more display modules, wherein each display module comprises a plurality of light-emitting elements mounted to a front face of the display module, wherein the light-emitting elements of the plurality of the display modules are configured to collectively display one or more of video, graphical, or textual information on the display surface;
   one or more tension members configured to be coupled to and hang from a support structure external to the display system such that the one or more tension members support the display in a hanging manner from the support structure so that the display is vertically below the support structure; and
   one or more base supporting members coupled to one or more of the display modules of a bottom-most row of the plurality of vertically adjacent rows located at a vertical bottom of the display;
   wherein the one or more tension members hang from the support structure down to the vertical bottom of the display and couple to the one or more base supporting members, thereby supporting the one or more base supporting members such that the one or more tension members and the one or more base supporting members provide underlying support to the bottom-most row, and wherein the bottom-most row provides underlying support for vertically adjacent module rows that are vertically above the bottom-most row, so that the one or more tension members and the one or more base supporting members provide underlying support to all of the plurality of the vertically adjacent rows of the display modules of the display surface, and wherein the primary support for all of the plurality of the vertically adjacent rows of the display modules of the display surface is from the underlying support.

2. The display system of claim 1, further comprising one or more intermediate alignment members each located vertically above the one or more base supporting members, wherein the one or more intermediate alignment members perform at least one of:
guiding or aligning the one or more tension members relative to one or more of the plurality of the display modules;
aligning one or more of the display modules at a specified orientation relative to another one or more of the display modules; and
positioning one or more of the display modules relative to another one or more of the display modules.

3. The display system of claim 1, further comprising a support cabinet at least partially enclosing an interior space.

4. The display system of claim 3, wherein one or more of the plurality of the display modules are coupled to the support cabinet.

5. The display system of claim 3, wherein the one or more base supporting members are coupled to the support cabinet.

6. The display system of claim 3, wherein at least a portion of each of the one or more base supporting members are positioned in the interior space.

7. The display system of claim 3, wherein the one or more tension members extend through the interior space of at least a portion of the support cabinet.

8. The display system of claim 1, wherein the one or more base supporting members are directly connected to one or more of the display modules of the bottom-most row.

9. The display system of claim 1, wherein at least a portion of each of the one or more base supporting members is positioned vertically below one or more of the display modules of the bottom-most row such that the portion of the one or more base supporting members directly supports one or more of the display modules of the bottom-most row.

10. The display system of claim 1, wherein the one or more tension members and the one or more base supporting members are sufficient to support a weight of the display surface when the one or more tension members are connected to the support structure external to the display system without any other supporting structures to support the weight of the display surface.

11. The display system of claim 1, wherein the underlying support provided by the one or more base supporting members is the only support provided to the plurality of the display modules.

12. A display system, comprising:
a display comprising first and second display surfaces, wherein the first display surface is formed from a plurality of vertically adjacent first rows each comprising one or more first display modules and the second display surface is formed from a plurality of vertically adjacent second rows each comprising one or more second display modules, wherein each of the first display, modules comprises a plurality of first light-emitting elements mounted to a front face of the first display module, wherein each of the second display modules comprises a plurality of second light-emitting elements mounted to a front face of the second display module, wherein the first light-emitting elements of the plurality of the first display modules are configured to collectively display one or more of video, graphical, or textual information on the first display surface, and wherein the second light-emitting elements of the plurality of the second display modules are configured to collectively display one or more of video, graphical, or textual information on the second display surface;
one or more tension members configured to be coupled to and hang from a support structure external to the display system such that the one or more tension members support the display in a hanging manner from the support structure so that the display is vertically below the support structure; and
one or more base supporting members coupled to one or more of the first display modules of a first bottom-most row of the plurality of vertically adjacent first rows and to one or more of the second display modules of a second bottom-most row of the plurality of vertically adjacent first rows, wherein the first bottom-most row and the second bottom-most row are located at the vertical bottom of the display;
wherein the one or more tension members hang from the support structure down to the vertical bottom of the display and couple to the one or more base supporting members, thereby supporting the one or more base supporting members such that the one or more tension members and the one or more base supporting members provide underlying support to the first bottom-most row and the second bottom-most row, wherein the first bottom-most row provides underlying support for vertically adjacent first rows that are vertically above the first bottom-most row and the second bottom-most row provides underlying support for the vertically adjacent second rows that are vertically above the second bottom-most row, so that the one or more tension members and the one or more base supporting members provide underlying support to all of the plurality of the vertically adjacent first rows of the first display modules of the first display surface and all of the plurality of the vertically adjacent second rows of the second display modules of the second display surface, and
wherein the primary support for all of the plurality of the vertically adjacent first rows of the first display modules of the first display surface and for all of the plurality of the vertically adjacent second rows of the second display modules of the second display surface is from the underlying support.

13. The display system of claim 12, further comprising one or more intermediate alignment members each located vertically above the one or more base supporting members, wherein the one or more intermediate alignment members perform at least one of:
guiding or aligning the one or more tension members relative to one or more of the first and second display modules;
aligning one or more of the first and second display modules at a specified orientation relative to another one or more of the first and second display modules; and
positioning one or more of the first and second display modules relative to another one or more of the first and second display modules.

14. The display system of claim 12, wherein the first and second display modules of the first and second display surfaces at least partially enclose an interior space, wherein the first display modules are on a first side of the interior space and the second display modules are on a second side of the interior space.

15. The display system of claim 14, wherein at least a portion of each of the one or more base supporting members are positioned in the interior space.

16. The display system of claim 14, wherein the one or more tension members extend through at least a portion the interior space.

17. The display system of claim 12, wherein the one or more base supporting members are directly connected to one or more of the first display modules of the first bottom-most row of vertically adjacent first rows and to one or more of the second display modules of the second bottom-most row of vertically adjacent second rows.

18. The display system of claim 12, wherein at least a portion of each of the one or more base supporting members is positioned vertically below one or more of the first display modules of the first bottom-most row of vertically adjacent first rows and one or more of the second display modules of the second bottom-most row of vertically adjacent second rows such that the portions of the one or more base supporting members directly support the one or more of the first display modules of the first bottom-most row of vertically adjacent first rows and the one or more of the second display modules of the second bottom-most of vertically adjacent second rows.

19. The display system of claim 12, wherein the one or more tension members and the one or more base supporting members are sufficient to support a weight of the display when the one or more tension members are connected to the support structure external to the display system without any other supporting structures to support the weight of the display.

20. The display system of claim 12, wherein the underlying support provided by the one or more base supporting members is the only support provided to the pluralities of the first and second display modules.

\* \* \* \* \*